(12) United States Patent
Shao et al.

(10) Patent No.: US 10,896,897 B2
(45) Date of Patent: Jan. 19, 2021

(54) LED DISPLAY MODULE AND METHOD OF MAKING THEREOF

(71) Applicant: SCT LTD., Grand Cayman (KY)

(72) Inventors: Shihfeng Shao, Milpitas, CA (US); Chang Hung Pan, Milpitas, CA (US); Heng Liu, Milpitas, CA (US); Eric Li, Milpitas, CA (US)

(73) Assignee: SCT LTD., Grand Cayman (KY)

( * ) Notice: Subject to any disclaimer, the term of this patent is extended or adjusted under 35 U.S.C. 154(b) by 0 days.

(21) Appl. No.: 16/372,089

(22) Filed: Apr. 1, 2019

(65) Prior Publication Data

US 2020/0312819 A1 Oct. 1, 2020

(51) Int. Cl.
*H01L 25/075* (2006.01)
*H01L 33/62* (2010.01)
*H01L 25/13* (2006.01)
*H01L 21/66* (2006.01)

(52) U.S. Cl.
CPC .......... *H01L 25/0753* (2013.01); *H01L 22/14* (2013.01); *H01L 25/13* (2013.01); *H01L 33/62* (2013.01); *H01L 2933/005* (2013.01); *H01L 2933/0066* (2013.01)

(58) Field of Classification Search
CPC ..... H01L 25/0753; H01L 33/62; H01L 25/13; H01L 22/14; H01L 2933/0066; H01L 2933/005
See application file for complete search history.

(56) References Cited

U.S. PATENT DOCUMENTS

| | | | |
|---|---|---|---|
| 2010/0039579 A1* | 2/2010 | Park | G02F 1/133603 349/58 |
| 2011/0163691 A1* | 7/2011 | Dunn | G09G 3/3426 315/297 |
| 2017/0069611 A1* | 3/2017 | Zhang | H01L 25/50 |

* cited by examiner

*Primary Examiner* — Anthony Ho
(74) *Attorney, Agent, or Firm* — Novick, Kim & Lee, PLLC; Allen Xue

(57) ABSTRACT

An LED display module includes an LED package having one or more layers of molding compound and containing an array of LED chips disposed therein, a plurality of conductive pads disposed on a surface of the LED package away from the array of LED chips, a network of conductive tracks connecting the array of LED chips with each other, and a plurality of conductive paths connecting the plurality of conductive pads and the network of conductive tracks. The network of conductive tracks includes a first layer of conductive tracks connecting the array of LED chips with each other, and a second layer of conductive tracks disposed substantially between the first layer of conductive tracks and the plurality of conductive pads.

18 Claims, 15 Drawing Sheets

LED DISPLAY MODULE AND METHOD OF MAKING THEREOF

TECHNICAL FIELD

The present disclosure relates to a light-emitting diode (LED) display module and display panel made of such modules, and more particularly, to an LED display module made of LED chips having built-in conductive paths.

RELATED ART

LED packages are assemblies that house LED chips. The functions of LED packages include protecting the LED chips and welded lead wires from direct contact with the environment, securing and encapsulating the chip with epoxy or silicone resin, and allowing for versatility and standardization in LED lighting applications. Many types of LED packages are in use today for different applications and with different advantages and shortcomings. Surface-mount device (SMD) LED, chip-on-board (COB) LED, Multi-COB (MCOB) LED are several categories of the common LED packaging technologies, among which COB technology provides better lumen-per-watt ratios and efficiency than common SMD LEDs.

A COB or MCOB LED module has an array of LED chips bonded directly to a substrate, e.g., a printed circuit board (PCB). Since a COB LED does not require accessories such as the lead frame, it takes up less space on the PCB so that the COB LED module can have a greater density of LEDs than that of the SMD LED module. When the COB LED package is energized, it may have the appearance of a uniform lighting panel, rather than an array of individual lights as would be the case when using SMD LEDs mounted closely together.

A COB LED module may be one of two types of COB, i.e. a wire-bond COB and a flip chip COB. In the wire-bond COB, a lateral LED chip is bonded on a PCB substrate by a bonding epoxy and connects to conductive pads on the PCB via two bonding wires. The thermal energy generated by the lateral LED chip is dissipated through the chip's sapphire substrate, bonding epoxy, followed by the PCB substrate. On the other hand, a flip chip COB has the LED chip directly bonded on conductive pads on a PCB without the bonding wire and epoxy. The heat generated by the flip chip LED is dissipated through chip bonding pads, the conductive pads, and the PCB, in that order. Compared with the wire-bond COB, the flip chip COB exhibits less thermal resistance as its thermal dissipating path excludes the sapphire substrate and bonding epoxy, which are materials having relatively higher thermal resistance. Also, the packaging cost is lower without bonding wires and their associated bonding processes.

An LED module tends to generate a significant amount of heat when energized, which may require active cooling. Consequently, metal core PCBs are frequently chosen for LED applications due to their enhanced ability to dissipate heat. Although the metal core PCB transfers and dissipates heat with a greater efficiency than a traditional rigid PCB, it is expensive. In the COB LED module, the manufacturing cost of metal core PCB increases even further because it needs more layers or more elaborate pattern printings in a PCB to accommodate densely packed LEDs along with their associated conductive pads and conductive tracks in the limited space. Multi-layered PCB with complex trace patterns can also make it difficult to curb noise on the PCB and control other performance parameters. Thus, there is a need for new methods of making LED modules that overcome the above-identified problems.

SUMMARY

The present disclosure provides LED assemblies, LED display modules and their fabricating methods. In one of the embodiments, the LED assembly contains an LED array, a passivation layer disposed about the LED array, and an array of metal pads. The LED array has a plurality of LED chips, each LED chip having a first terminal and a second terminal. The first terminal of each LED chip in the LED array is electrically coupled to a first network of conductive tracks, and the second terminal of each LED chip in the LED array is electrically coupled to a second network of conductive tracks. Each metal pad in the array of metal pads has a first surface in contact with the passivation layer and a second surface positioned outside of the passivation layer. The first terminal and the second terminal of an LED chip are respectively electrically coupled to the first surfaces of two separate metal pads in the array of metal pads.

In addition, the first network of conductive tracks and the second network of conductive tracks both include traces disposed in a planar direction and in a vertical direction in the passivation layer. The passivation layer comprises one or more dielectric materials.

In one aspect of this embodiment, the first thermal is a cathode and the second terminal is an anode. In another aspect, the first terminal is an anode and the second terminal is a cathode.

In another embodiment, the first network of conductive tracks has traces residing in a first plane and the second network of conductive tracks has traces residing in a second plane, and a first plurality of via holes are disposed between the first plane and the second plane.

In a further embodiment, the first surfaces of metal pads in the array of metal pads reside on a third plane in the passivation layer, and a second plurality of via holes are disposed between the second plane and the third plane.

In a further aspect of embodiments in this disclosure, the LED chips in the array of LED chips include red LED chips, green LED chips, and red LED chips.

The currently disclosure also provide a method of fabricating a light emitting diode (LED) assembly. The method includes disposing an LED array comprising a plurality of LED chips on a carrier panel, wherein each LED chip in the LED array has a first terminal and a second terminal that face away from the carrier panel; covering the LED array with a molding compound layer; disposing a first passivation layer on the molding compound layer; disposing a second passivation layer on the first passivation layer; disposing an array of metal pads on the second passivation layer; forming a first network of conductive tracks in the first passivation layer; and forming a second network of conductive tracks in the second passivation layer.

In one aspect of this embodiment, the first network of conductive tracks connect the first terminal of each LED chip in the LED array and at least one metal pad in the array of metal pads while the second network of conductive tracks connect the second terminal of each LED chip in the LED array and at least one metal pad in the array of metal pads.

In another aspect of this embodiment, the method further include attaching the array of metal pads to a plurality of testing circuits; and testing the LED array on the carrier panel.

In the embodiments of this disclosure, each LED chip in the LED array is a substrate-less LED chip.

In still an embodiment of the current disclosure, the LED display panel, include a plurality of LED tiles, each LED tile include a plurality of LED assembly mounted to a printed circuit board (PCB). The LED array can be arranged in either a common cathode topology or a common anode topology.

BRIEF DESCRIPTION OF THE DRAWINGS

The teachings of the present invention can be more readily understood by considering the following detailed description in conjunction with the accompanying drawings.

DETAILED DESCRIPTION

Figure 1:
FIGS. 1, 2A, 3A, 4A, 5A, 6A, 7A, 8A and 9A illustrate a method of fabricating a LED package containing an array of LED chips according to the first embodiment of the present disclosure.

Reference will now be made in detail to embodiments of the present disclosure, examples of which are illustrated in the accompanying drawings. It is noted that wherever practicable, similar or like reference numbers may be used in the drawings and may indicate similar or like elements.

The drawings depict embodiments of the present disclosure for purposes of illustration only. One skilled in the art would readily recognize from the following description that alternative embodiments exist without departing from the general principles of the present disclosure.

FIGS. 1, 2A, 3A, 4A, 5A, 6A, 7A, 8A, and 9A respectively show snapshots in a method of fabricating a LED package containing an array of LED chips according to a first embodiment of the present disclosure.

FIG. 1 shows a carrier board 10 for carrying an array of LED chips. The carrier board 10 includes a base carrier board 11 and a thermal release tape 12 attached to the base carrier board 11. The base carrier board 11 is made of a material that can sustain elevated temperatures, such as glass, thermo set plastics, etc. The base carrier board 11 may be transparent or opaque. The thermal release tape 12 is an adhesive tape that adheres to the base carrier board 11 at room temperature but can be peeled off by heating at an elevated temperature, e.g., around 210° C.

Figure 2A:
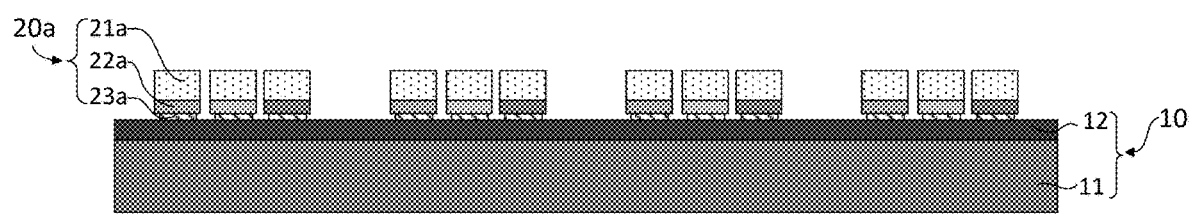

FIG. 2A shows the array of LED chips disposed on the carrier board 10. In this embodiment, each LED chip 20a has a base substrate 21a made of, e.g., sapphire or silicon carbide (SiC). A light emitting layer 22a is disposed on the base substrate 21a, which emits light of a certain color when energized. In this embodiment, each LED chip is a red LED (R), a green LED (G), and a blue LED (B). A cluster of the R, G, and B LEDs defines a display pixel. Each LED chip 20a having the base substrate 21a may have a same height, e.g., about 100 μm.

In this embodiment, each LED chip 20a has a p-electrode and an n-electrode, both designated as 23a. Some of the figures show only one of the electrodes since they may be oriented in a direction in which one electrode blocks the view of the other electrode. When placing the array of LED chips on the thermal release tape 12, the LED chips are flipped over such that one or both electrodes 23a in each LED chip 20a is/are directly attached to the surface of the thermal release tape 12.

Figure 3A:
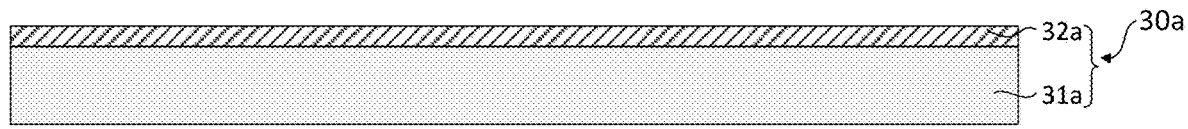

FIG. 3A shows a carrier panel 30a for carrying the array of LED chips. The carrier panel 30a may have the same width (or diameter) as the carrier board 10. The carrier panel 30a has a base carrier panel 31a and a temporary bonding adhesive (TBA) layer 32a disposed on the base carrier panel 31a. The base carrier panel 31a may be made of a transparent glass. Edges of this glass panel may be grinded to prevent breakage during the fabricating process. The TBA layer 32a may be deposited on a surface of the base carrier panel 31a by a spin coating process. It may have a thickness of about 10 μm thickness and may sustain a temperature up to 300° C.

Figure 4A:
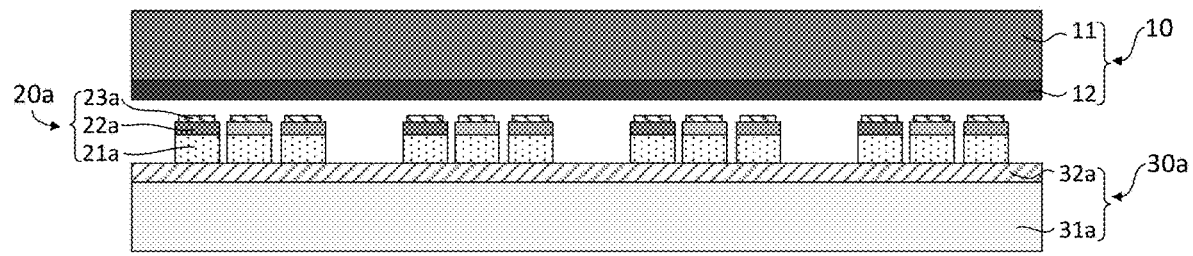

As shown in FIG. 4A, the carrier board 10 carrying the array of LED chips (prepared as illustrated in FIG. 2A) is flipped over and aligned with the carrier panel 30a such that the array of LED chips of the carrier board 10 is bonded to the TBA layer 32a of the carrier panel 30a. The carrier board 10 is then released from the array of LED chips by heating it up to a predetermined temperature, e.g., 210° C. The array of LED chips remains attached to the TBA layer 32a on the carrier panel 30a. As a result, the electrodes 23a of the LED chip 20a are exposed.

Figure 5A:
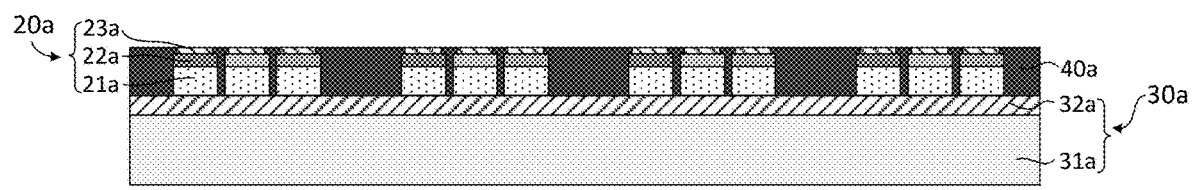

In FIG. 5A, the carrier panel 30a having the array of LED chips is covered by the molding layer 40a, which can be an opaque molding compound such as a black resin. The black resin may be a mixture of black pigment and a resin, an epoxy, or a silicone.

Figure 6A:
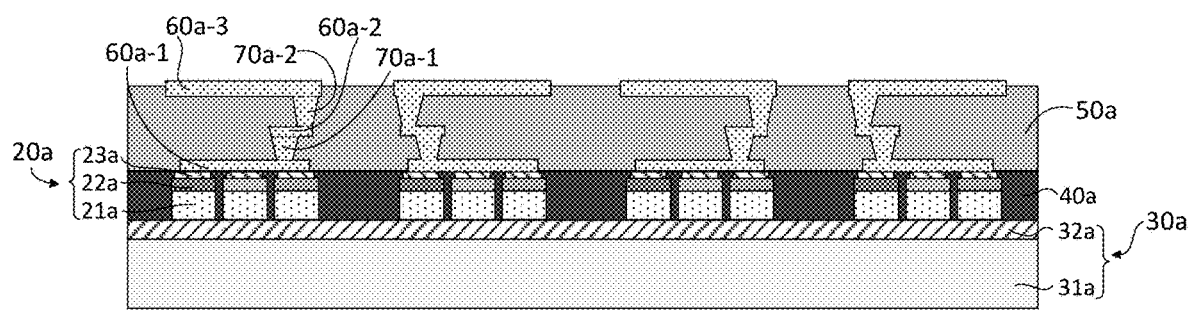

FIG. 6A schematically shows three layers of interconnected traces and/or pads. The first layer 60a-1 is disposed on the molding layer 40a and in contact with the LED array. The second layer 60a-2 is disposed above the first layer 60a-1 while the third layer 60a-3 is disposed above the second layer 60a-2. All three layers are partially or completely disposed in the interconnection layer 50a. The interconnection layer 50a is made of a passivation compound.

The first layer 60a-1 or the second layer 60a-2 each contains a network of conductive traces that connect either anodes or cathodes of the LED array. When the network of traces connects the cathodes of LEDs in the LED array, it is referred to as the scan connection. When the network of traces connects anodes of the LEDs in the array, it is referred to as a cathode connection. In one embodiment, the first layer 60a-1 includes the scan connection and the second layer 60a-2 includes the cathode connection. Further, the second layer 60a-2 contains a plurality of bypass traces 61 (see FIG. 13C) not connected to the LED terminals, e.g., for the purposes of forming conductive passages between the first layer 60a-1 and the third layer 60a-3, "bypassing" the cathode connection in the second layer 60a-2. The third layer 60a-3 includes an array of metal pads. One side of the metal pads facing the second layer 60a-2 are connected to the first layer 60a-1 and the second layer 60a-2 through a plurality of via holes 70a-1 or 70b-1, while the opposite side of the metal pads are exposed for bonding to the PCB and/or other devices.

Referring back to FIG. 6A, the first layer 60a-1 and the second layer have traces that link the terminals of the LEDs in the LED array. The layer of metal pads 60a-3 is also connected with the first layer 60a-1 and the second layer 60a-2. Specifically, the first layer 60a-1 is electrically connected to the second layer 60a-2 through a first set of via holes 70a-1, which are filled with a conductive material. The second layer 60a-2 is electrically connected to the layer of metal pads 60a-3 through a second set via holes 70a-2.

It is noted that FIGS. 6A, 6B, 7A, 7B, 8A, 8B, 9A, 9B, and 11 are simplified drawings that show the positional relationship amongst the LEDs, the three layers, and carrier boards in the vertical direction but are not necessarily the actual view of a cross section between a flat plane and the LED package. In an actual product the cross section of the LED array, the cross section of the metal pads labeled 60a-3, and the cross section of traces labeled 60a-2, the cross section of traces labeled 60a-1, and the cross section of the via holes labeled 70a-1 or 70a-2 may not reside on a same flat plane. The layout and interconnections amongst the LED array, layers 60a-1, 60a-2, 60a-3, as well as bypass traces 61 are better shown and explained with reference to FIGS. 13C and 13D elsewhere in this disclosure.

FIGS. 12A to 12I further illustrate steps in an exemplary method for building interconnected traces/pads in the interconnection layer 50a, e.g., on the device of FIG. 5A to obtain the device of FIG. 6A.

Figure 12A:
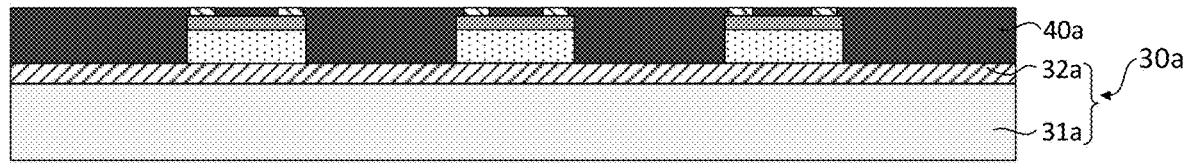
FIGS. 12A to 12I illustrate steps in building a layered structure on a molding layer, which are applicable in the embodiments of the present disclosure.

FIG. 12A shows the device after the molding layer 40a (e.g., epoxy) is deposited on the carrier panel 30a, which has the base carrier panel 31a (e.g., glass panel) and the TBA layer 32a (e.g., glue). The surface of the molding layer 40a may be cleaned using oxygen plasma.

Figure 12B:
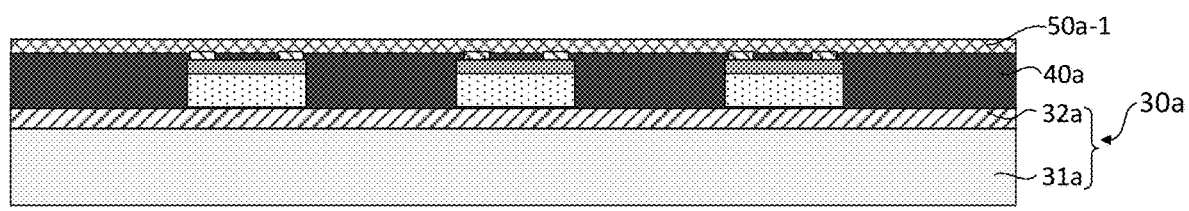

In FIG. 12B, the first conductive material is deposited on the molding layer 40a, e.g., using an electron beam deposition by an electron gun to form a first conductive layer 50a-1. The first conductive material may have a layer of titanium (Ti) and a layer of copper (Cu), which are deposited in two separated steps.

Figure 12C:
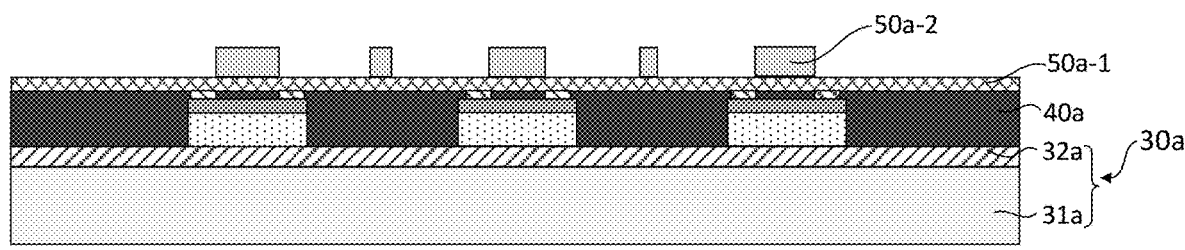

FIG. 12C shows a photoresist (PR) material disposed on the first conductive layer 50a-1 to form a first convex layer 50a-2. This process begins by coating the first conductive layer 50a-1 with the PR material to form a PR layer. A patterned mask is then applied on the surface of the PR layer to block light so that only unmasked regions of the material is exposed to light. A solvent, called a developer, is then applied to the PR layer. The PR material, degraded by light, dissolves away in the developer, leaving behind a coating (i.e., first convex layer 50a-2) matching the pattern of the mask. After this photoengraving process, the first conductive layer 50a-1 and the first convex layer 50a-2 may be cleaned using oxygen plasma.

Figure 12D:
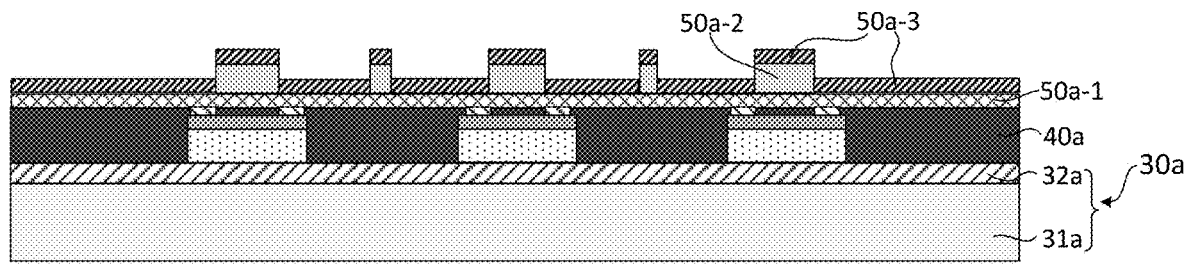

In FIG. 12D, the first conductive layer 50a-1 and the first convex layer 50a-2 are covered by a second conductive material to form a second conductive layer 50a-3. This process may be performed by electroplating, which requires an electric current, or by an electrode-less plating, which is in autocatalytic chemical process. In electroplating, an ionic metal is supplied with electrons to form a non-ionic coating on a substrate. In this embodiment, a layer of copper may be deposited to cover the first conductive layer 50a-1 and the first convex layer 50a-2.

Figure 12E:
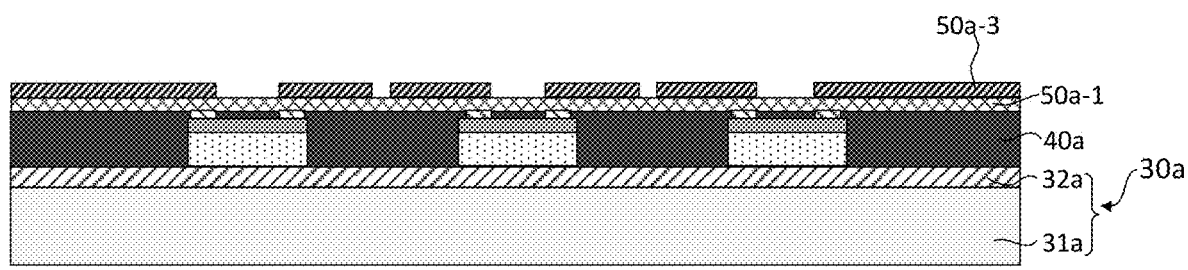
Figure 12F:
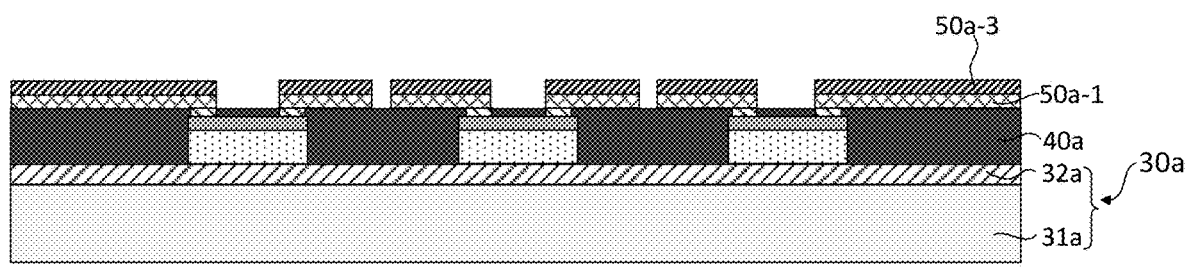

As shown in FIG. 12E, the first convex layer 50a-2 is removed to expose the trace on the first conductive layer 50a-1. This stripping process may be performed through a photoresist stripping by dry etching using a plasma etching equipment. During this stripping process, the second conductive material (i.e., copper) deposited on the first convex layer 50a-2 is also removed. The traces in the first conductive layer 50a-1 is further removed by etching to expose a portion of the molding layer 40a, as shown in FIG. 12F. This etching process may be performed using a laser etching or a plasma etching.

Figure 13A:
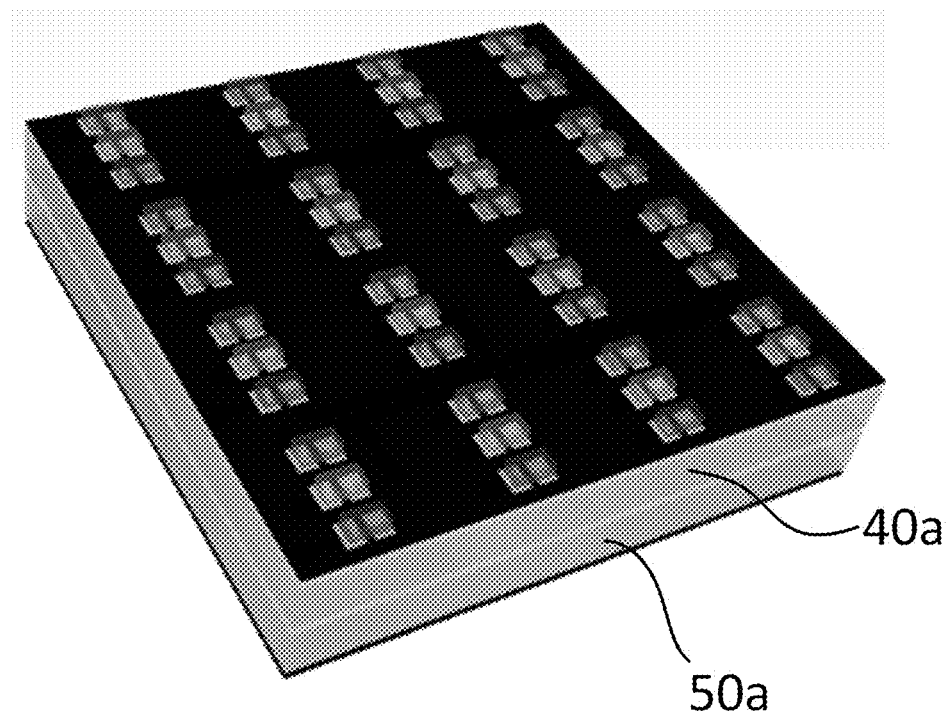
FIG. 13A is a perspective view of a 4×4 LED package of the present disclosure.
Figure 13B:
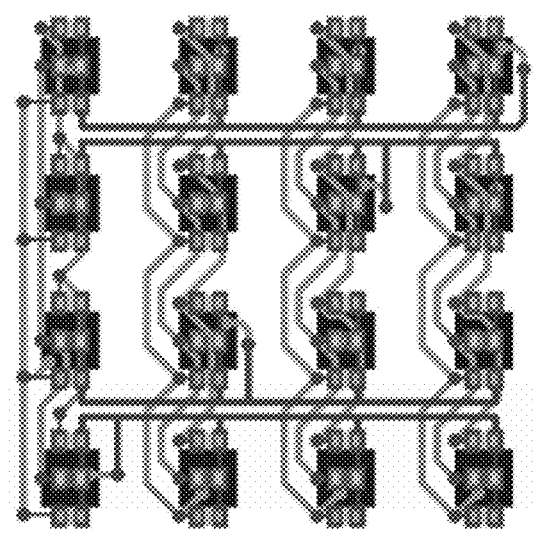
FIG. 13B is a top view of multiple layers interconnected pads and traces connecting the 4×4 LED package in FIG. 13A.
Figure 13C:
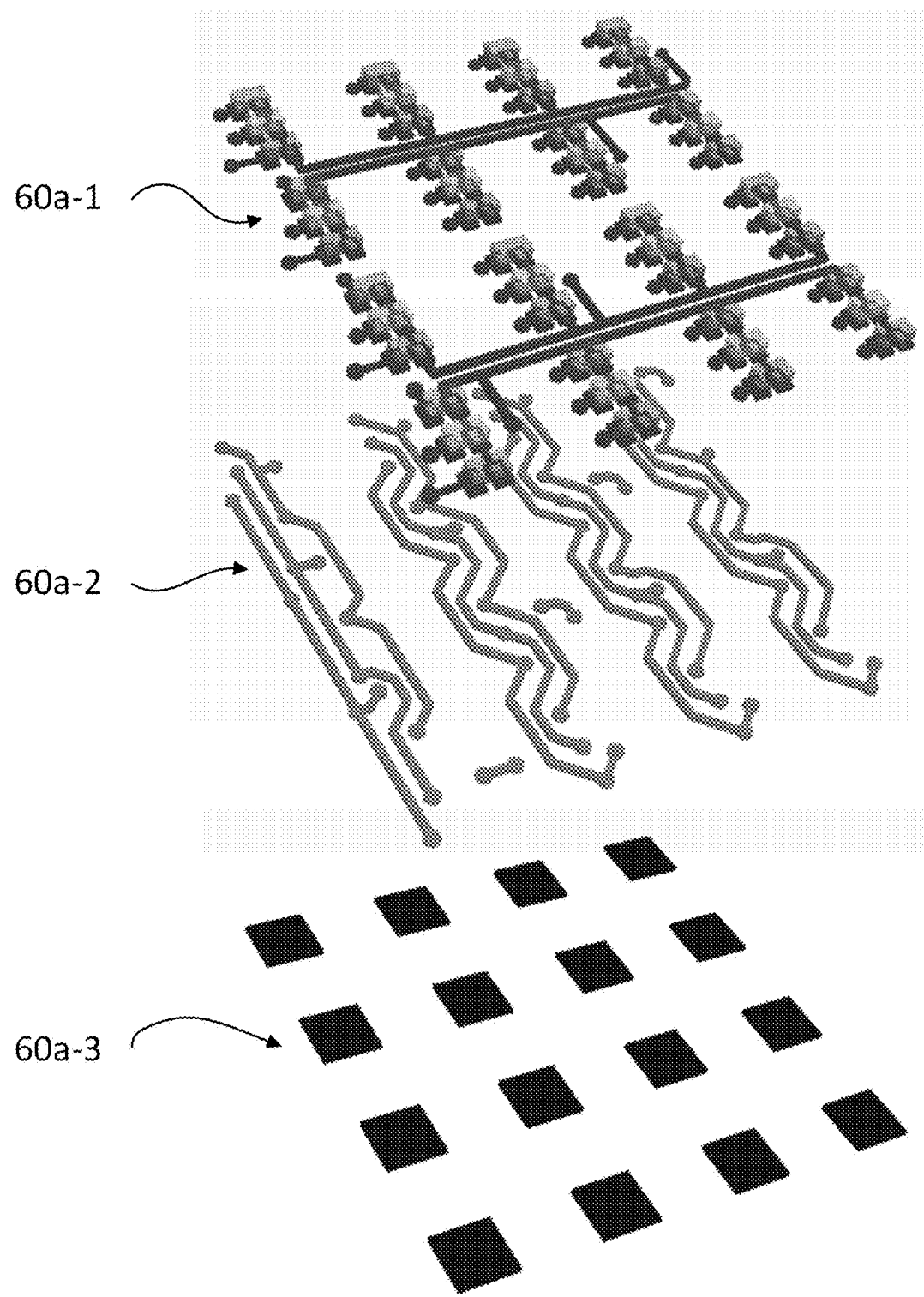
FIG. 13C is an exploded view of the LED package in FIG. 13B.

In this embodiment, the remaining portions of the first conductive layer 50a-1 and the second conductive layer 50a-3 form the first layer 60a-1 in FIG. 6A or FIG. 13C.

Figure 12G:
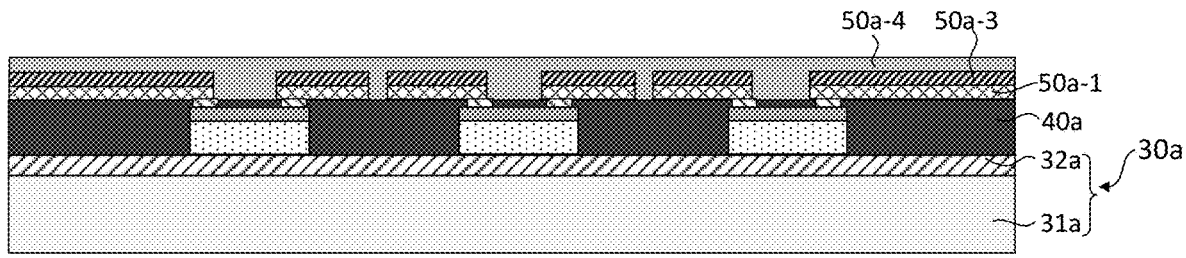
Figure 12H:
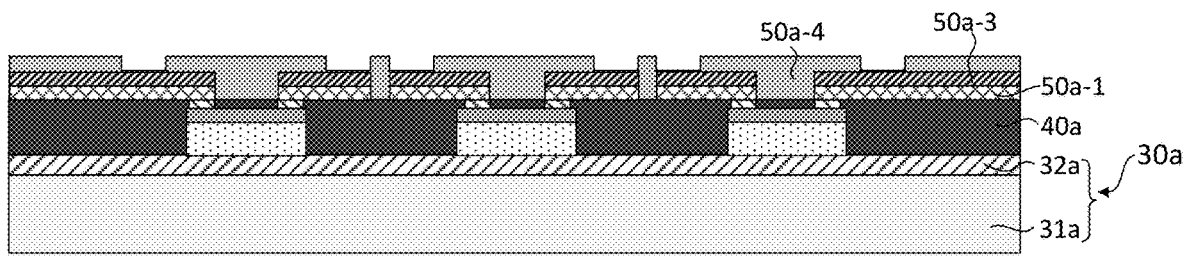

In the step shown in FIG. 12G, a first dielectric material is coated on the second conductive layer 50a-3 and the exposed portion of the molding layer 40a to form a first passivation layer 50a-4. The process may be performed by a surface passivation with SiNR (Silicene Nanoribbon). Then, as shown in FIG. 12H, a plurality of via holes or trenches are formed in the first passivation layer 50a-4, e.g., by laser etching. After this etching process, the surface of the first passivation layer 50a-4 may be cleaned by plasma ashering or descumming.

Figure 12I:
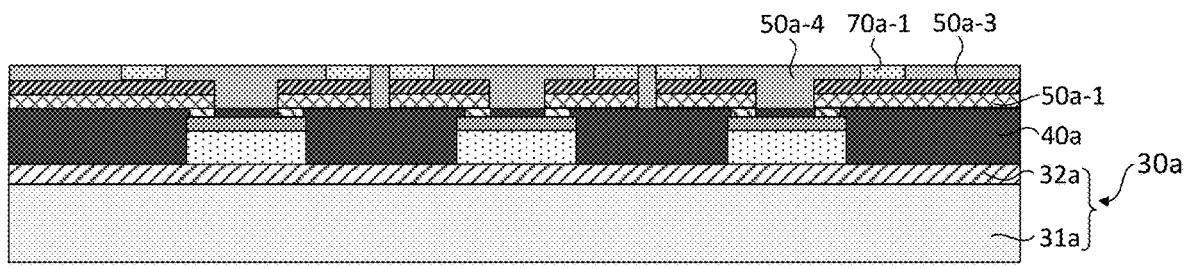

As shown in FIG. 12I, the third conductive material fills the plurality of via holes or trenches to form the first set of conductive paths through via holes 70a-1. This process may be performed using an electron beam evaporation or an inkjet printing. The third conductive material may be tin-lead, nickel, silver, or gold, or a mixture of tin-lead and silver.

The steps specified in FIGS. 12B to 12I can be repeated to build additional layers on top of one another and interconnecting paths between the layers. For example, a fourth conductive material can be deposited on the first passivation layer 50a-4, e.g., by electron beam deposition to form a fourth conductive layer (similar to the step shown in FIG. 12B, in which 50a-1 is deposited on 40a), a photoresist (PR) material is disposed on the fourth conductive layer to form a second convex layer (similar to FIG. 12C), a fifth conductive material is deposited on the fourth conductive layer and the second convex layer by a plating to form a fifth conductive layer (similar to FIG. 12D), the second convex layer is stripped away to expose the trace on the fourth conductive layer (similar to FIG. 12E), the fourth conductive layer at a portion of the trace is removed by laser etching to expose a portion of the passivation layer (similar to FIG. 12F), and the fifth conductive layer and the exposed portion of the first passivation layer 50a-4 is coated by a second passivation material to form a second passivation layer (similar to FIG. 12G). Then, a plurality of via holes or trenches are formed on the second passivation layer by etching (similar to FIG. 12H), and a sixth conductive material is deposited within the plurality of via holes 70a-2 to form the second set of conductive paths (similar to FIG. 12I). In this embodiment, the remaining fourth and fifth conductive layers constitute the second layer 60a-2 as shown in FIG. 6A and FIG. 13C.

The metal pads in the third layer 60a-3 may be disposed on the second passivation layer. In this embodiment, the metal pads are flat, usually tin-lead, silver, or gold-plated copper pads without holes. This process may be conducted by electroless nickel with immersion gold coating (ENIG). In a preferred embodiment, the first and second passivation layers are dark. In an alternative embodiment, the second passivation layer may be covered by an opaque molding compound before disposing the plurality of conductive pads. The first and second passivation layers, alone or with another additional molding layer, may constitute the interconnection layer 50a in FIG. 6A.

Figure 7A:
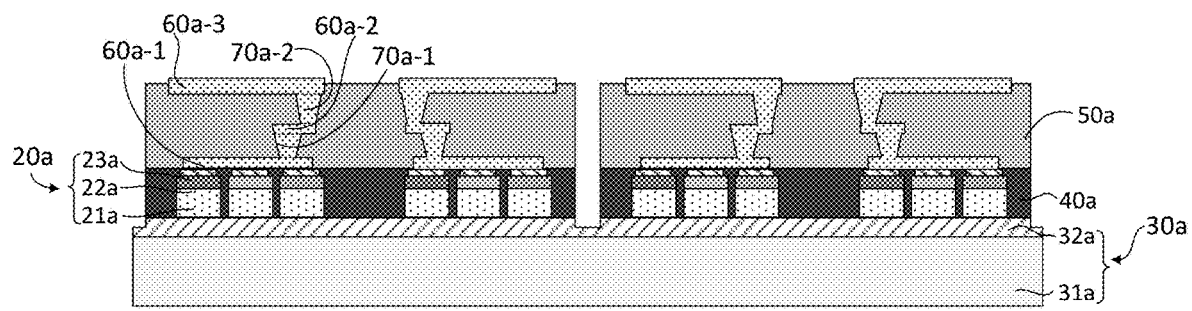

The device in FIG. 6A can be cut to make LED packages. In FIG. 7A, the molding layer 40a and the interconnection layer 50a are cut in a direction perpendicular to the top surface of the interconnection layer 50a by plasma dicing or a dicing saw to separate the plurality of LED packages from each other. In this embodiment, it is preferred to cut the TBA layer 32a, at least in part, together with the molding layer 40a and the interconnection layer 50a so that the TBA layer 32a, along with other layers, may be de-bonded from the base carrier panel 31a (see FIG. 9A).

Figure 8A:
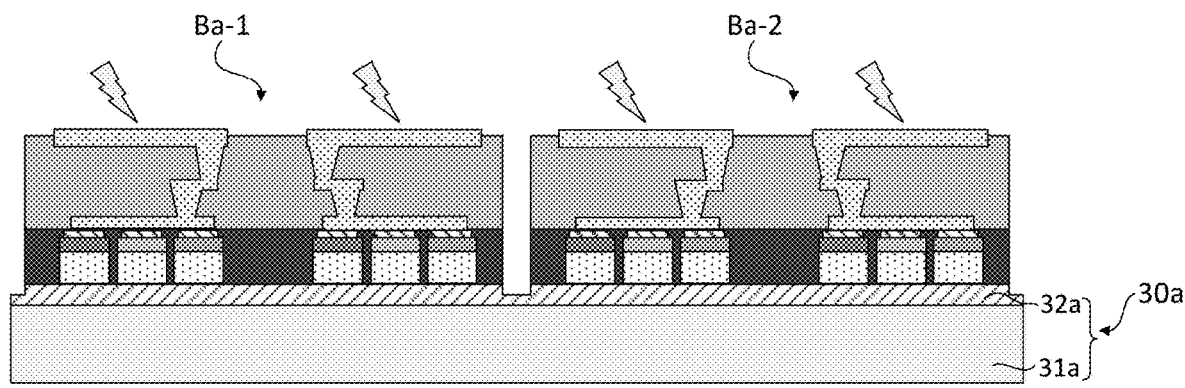

FIG. 8A shows that each LED package (Ba-1 or Ba-2) may be tested and sorted according to physical characteristics of LED chips in each LED package (commonly called as "binning"). Although not shown in the drawings, in an alternative embodiment, prior to cutting, a plurality of testing circuits may be disposed on the interconnection layer 50a to connect the plurality of metal pads, and the total LED chips may be tested to measure the performance characteristics of the LED chips, and then the molding layer 40a and the interconnection layer 50a may be cut in a vertical direction by a plasma dicing or a dicing saw to make LED packages.

Figure 9A:
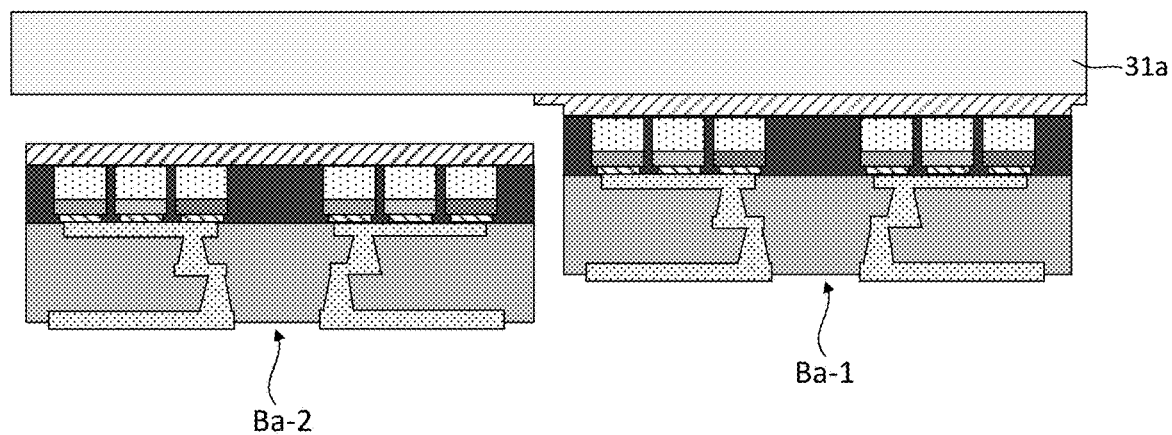
Figure 10:
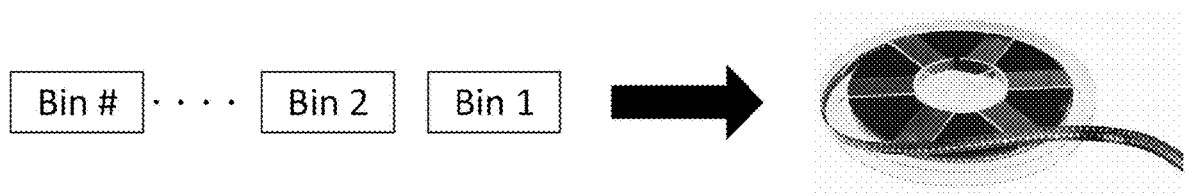
FIG. 10 shows the step of tape and reel packaging of a plurality of LED packages fabricated using methods of the present disclosure.

After the binning, each LED package (Ba-1 or Ba-2) may be de-bonded from the carrier panel 30a (FIG. 9A). In a preferred embodiment, the TBA layer 32a is de-bonded together with each LED package for later attachment to a reel. After de-bonding, the remaining base carrier panel 31a may be recycled and reused. As shown in FIG. 10, the plurality of LED packages, de-bonded from the carrier panel 30a, are tape and reel packaged.

Figure 11:
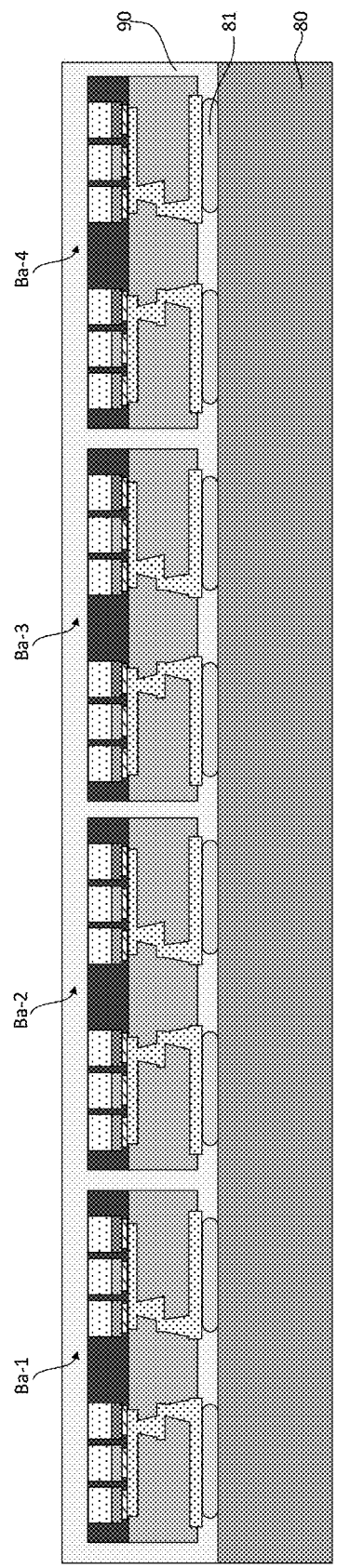
FIG. 11 is a schematic view illustrating a lateral cross section of an LED package according to the first embodiment of the present disclosure.

In FIG. 11, the plurality of LED packages (Ba-1, Ba-2, Ba-3, Ba-4) are mounted on a printed circuit board (PCB) 80, e.g., by a surface mount technology (SMT) process using soldering. Although not shown in FIG. 11, the PCB 80 may contain a plurality of electronic components, including integrated circuit (IC) passive components such as inductors, resistors, capacitors, etc. On the top surface of the PCB 80, conductive pads are disposed to be connected with the metal pads of each LED package. In some embodiments, the metal pad is flat, usually tin-lead, silver, or gold-plated copper pads without holes. The PCB 80 may also include a driver circuit.

Although details of the driver circuit are not shown in the present disclosure, in some embodiments, the driver circuit may include a phase lock loop, a plurality of pulse width modulation engines, a configuration register, a plurality of gain adjustable fast charge current sources, and a serial input/output interface.

As a reflow soldering process, lead-free solder paste 81 may be disposed on the plurality of conductive pads on the top surface of the PCB 80, and the plurality of LED packages are arranged such that the metal pads of each LED package are attached to the solder paste 81 on each conductive pad of the PCB 80. After this SMT process, the plurality of LED packages mounted on the PCB 80 may be encapsulated by a transparent molding compound, e.g., epoxy to form an encapsulating layer 90.

FIGS. 2B, 3B, 4B, 4B, 5B, 6B, 7B, 8B, and 9B show a method of fabricating a LED package containing an array of LED chips according to a second embodiment of the present disclosure.

Figure 2B:
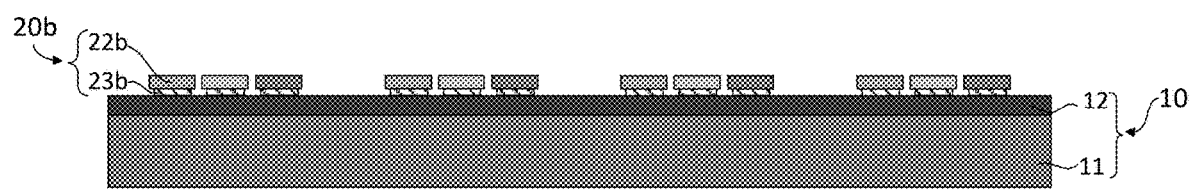
FIGS. 2B, 3B, 4B, 5B, 6B, 7B, 8B and 9B illustrate a method of fabricating a LED package containing an array of LED chips according to the second embodiment of the present disclosure.

In the second embodiment, the LED chip 20b does not have a base substrate. The LED chip or die usually has a light emitting layer, e.g., Indium gallium nitride (InGaN), on top of a sapphire substrate. A common alternative of the sapphire is silicon carbide (SiC). The sapphire substrate is commonly used because its thermal properties are similar to InGaN. However, the drawback of sapphire is that there is a large mismatch between its crystal lattice structure and that of InGaN. Such a mismatch introduces microcracks into the LED structure during manufacturing, which compromises LED efficacy. Without the base substrate, the manufacturing cost may be reduced and LED efficacy can be enhanced. Furthermore, the height of the LED chip 20b may be significantly reduced without such base substrate, and the thickness of the LED package will be reduced accordingly, which provides a thinner display module. In this embodiment, the LED chip 20b without the base substrate (as shown in FIG. 2B) may have a thickness of approximately 5 μm, which is much smaller than the LED chip 20a with the base substrate (as shown in FIG. 2A) having a thickness of approximately 100 μm. Detailed method for fabricating the LED package using such LED chip 20b without the base substrate will be explained below.

As shown in FIG. 2B, the array of LED chips is disposed on the carrier board 10 (see FIG. 1), in which the LED chip 20b does not have a base substrate. Each LED chip 20b without the base substrate may have a same height, e.g., about 5 μm. In this embodiment, each LED chip 20b has a p-electrode and an n-electrode, although the figure shows only one electrode 23b because of its orientation. When placing the array of LED chips on the thermal release tape 12, the LED chips are flipped over such that at least one of electrodes of each LED chip 20b is directly attached to the surface of the thermal release tape 12.

Figure 3B:
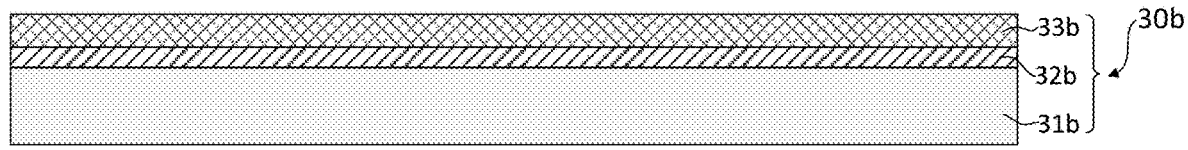

In FIG. 3B, a carrier panel 30b for carrying the array of LED chips is prepared. The carrier panel 30b may have the same width as the carrier board 10. The carrier panel 30b includes a base carrier panel 31b, a temporary bonding adhesive (TBA) layer 32b disposed on the base carrier panel 31b, and a transparent layer 33b disposed on the TBA layer 32b. The array of LED chips is disposed on the transparent layer 33b. The base carrier panel 31b may be made of a transparent glass. The transparent layer 33b may be formed by a transparent molding compound, e.g., epoxy, and may have a thickness of about 50 to 100 μm. The transparent layer 33b is thicker so that it serves some of the function of the base substrates, which is absent in this embodiment.

Figure 4B:
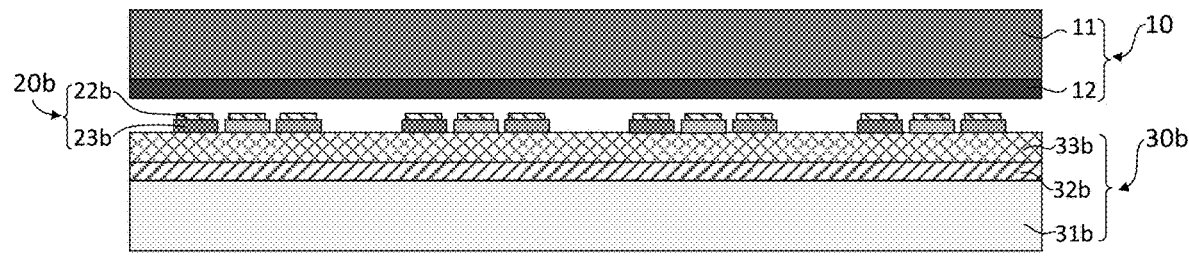

As shown in FIG. 4B, the carrier board 10 carrying the array of LED chips (prepared as illustrated in FIG. 2B) is flipped over and aligned with the carrier panel 30b such that the array of LED chips of the carrier board 10 is bonded to the transparent layer 33b of the carrier panel 30b, and then the carrier board 10 is released from the array of LED chips while the array of LED chips remains attached on the transparent layer 33b of the carrier panel 30b. As a result, the electrodes of each LED chip 20b are exposed.

Figure 5B:
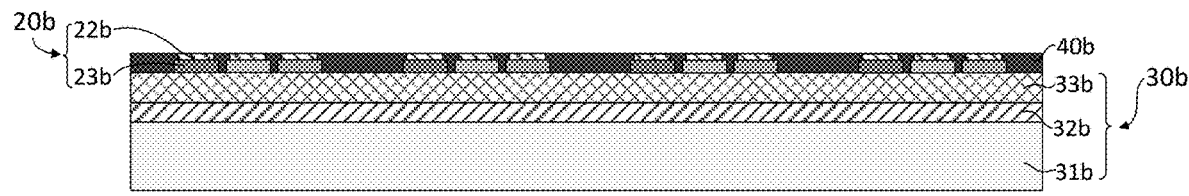

The carrier panel 30*b* having the array of LED chips is covered by an opaque molding compound to form a molding layer 40*b* (FIG. 5B).

Figure 6B:
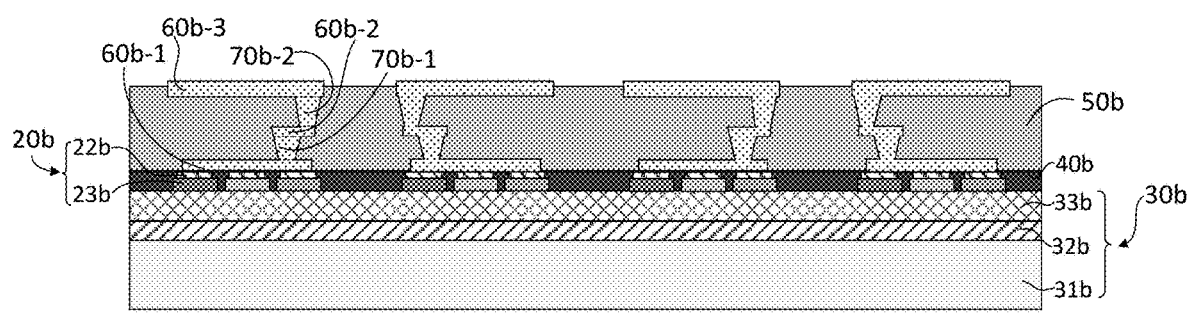

As shown in FIG. 6B, three conductive layers are constructed on the molding layer 40*b*, including a first layer 60*b*-1 (scan connection), a second layer 60*b*-2 (channel connection), and a layer of metal pads 60*b*-3 (also see FIG. 13C). The first layer 60*b*-1 is disposed on the molding layer 40*b* and electrically connects the array of LED chips with each other by a same electrode, and the second layer 60*b*-2, connecting the array of LED chip by another electrode, is disposed between the first layer 60*b*-1, and the third layer 60*b*-3 contains metal pads.

Likewise, the first layer 60*b*-1 or the second layer 60*b*-2 may contain either the scan connection or the channel connection. There are conductive paths through via holes 70*b*-1 and 70*b*-2 connecting the layers vertically so that the LEDs can be energized when connected to a power source. A passivation compound is covered on the molding layer 40*b* to form an interconnection layer 50*b*, which contains or supports the three conductive layers.

Figure 7B:
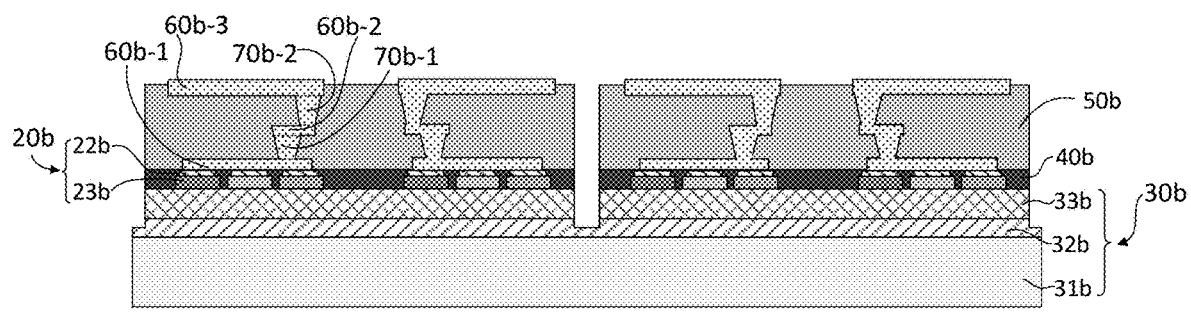

The device of FIG. 6B can likewise be constructed in the process illustrated by FIGS. 12A to 12I. It can be further cut into LED chips, tested, binned, and packaged as shown in FIGS. 7B, 8B, 9B, and 10. FIG. 7B shows that the molding layer 40*b*, the interconnection layer 50*b* and the transparent layer 33*b* are cut in a vertical direction with respect to a top surface of the interconnection layer 50*b* by a plasma dicing or a dicing saw to separate a plurality of LED packages from each other. In this embodiment, it is preferred to cut the TBA layer 32*b*, at least in part, together with the transparent layer 33*b*, so that the TBA layer 32*b*, along with other layers, may be de-bonded from the base carrier panel 31*b* (see FIG. 9B).

Figure 8B:
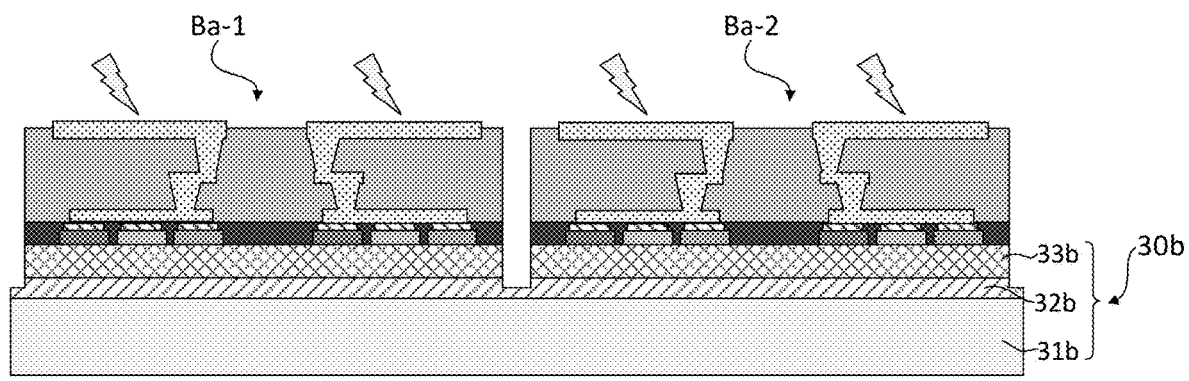

As shown in FIG. 8B, each LED package (Bb-1 or Bb-2) are tested and sorted according to physical characteristics of LED chips in each LED package (commonly called as "binning"). Although not shown in the drawings, in an alternative embodiment, prior to cutting, a plurality of testing circuits may be disposed on the interconnection layer 50*b* to interconnect the plurality of conductive pads, and all the LED chips may be tested through the plurality of testing circuits according to physical characteristics of the LED chips, and then the molding layer 40*b* and the interconnection layer 50*b* may be cut in a vertical direction by a plasma dicing or a dicing saw to separate a plurality of LED packages from each other.

Figure 9B:
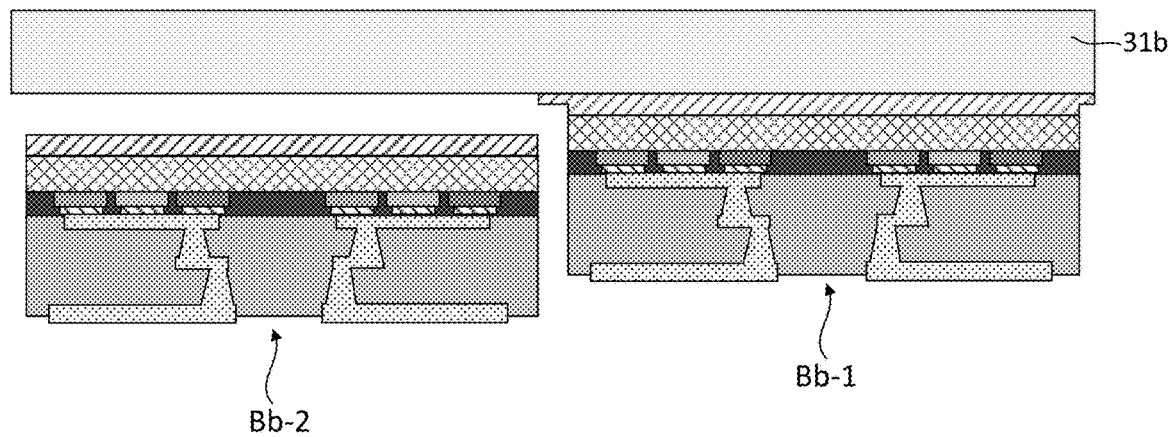

As shown in FIG. 9B, after the binning process, each LED package is de-bonded from the carrier panel 30*b*. In a preferred embodiment, the TBA layer 32*b* may be de-bonded together with each LED package for later attachment to a reel. After de-bonding, the remaining carrier panel 30*b* may be recycled and reused. In FIG. 10, the plurality of LED packages, de-bonded from the carrier panel 30*b*, are further tape and reel packaged, and then mounted on a printed circuit board (PCB) by a surface mount technology (SMT) process using the reflow soldering. After the SMT process, the plurality of LED packages mounted on the PCB may be encapsulated by a transparent molding compound, e.g., epoxy.

The LED package shown in FIGS. 9A and 9B has a 2×2 matrix of (a total of four) RGB LED units. Larger LED packages may contain 4×4 matrix or more. FIG. 13A shows a LED package having 4×4 matrix of RGB LED units (4×4 LED package) fabricated according to one embodiment of the present disclosure.

As shown in FIG. 13A, the 4×4 LED package includes a total of 16 RGB LED units, each having a red LED, a green LED, and a blue LED. The LED package has multiple layers, including a molding layer 40*a*, an interconnection layer 50*a*, and three conductive layers. FIGS. 13B and 13C show the LEDs as well as the three conductive layer (60*a*-1, 60*a*-2, 60*a*-3) but omitted the molding layer 60*a* and the interconnection layer 50*a*. The three conductive layers include the first layer 60*a*-1, a second layer 60*a*-2 of the network, and a third layer containing an array of metal pads. An array of RGB LEDs are disposed on the first layer 60*a*-1.

Figure 13D:
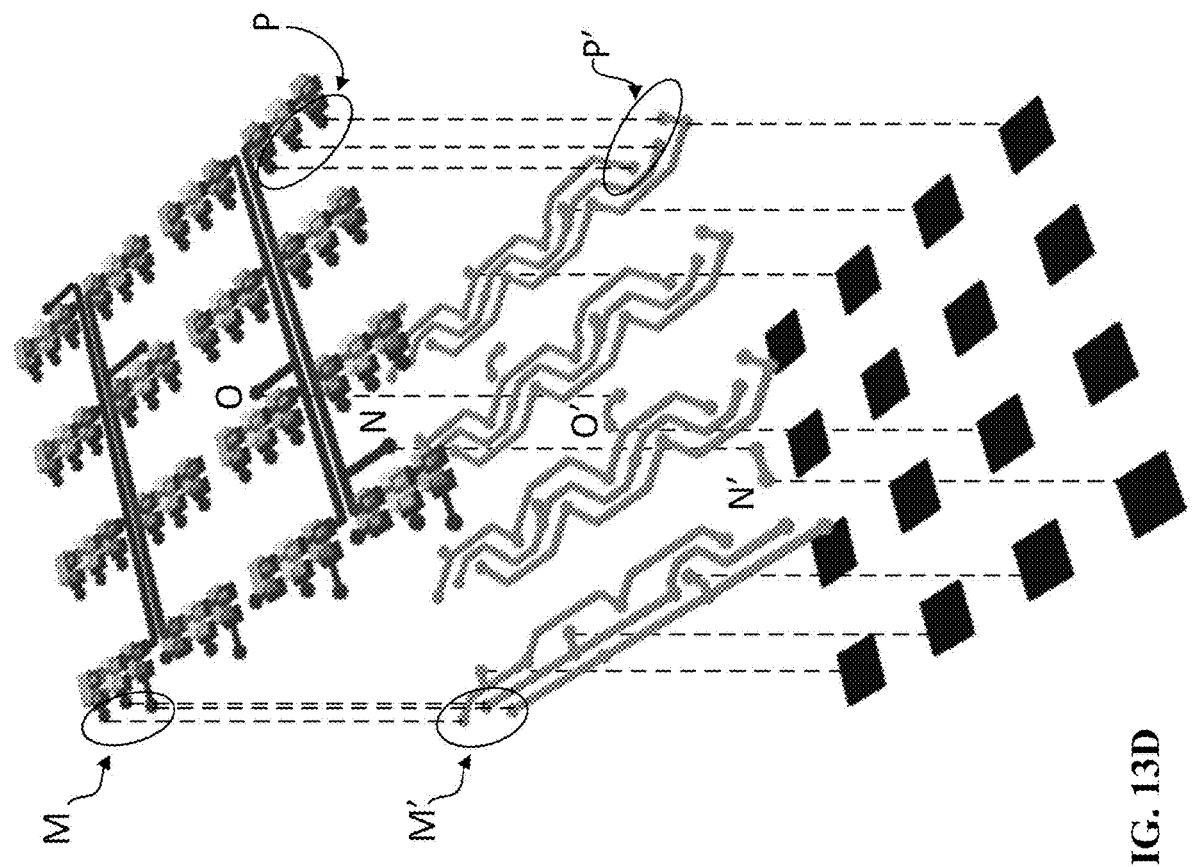
FIG. 13D illustrates connections among the R, G, B LEDs, the scan connection, the channel connection, and conductive pads in the 4×4 LED package in FIG. 13A.
Figure 13D:
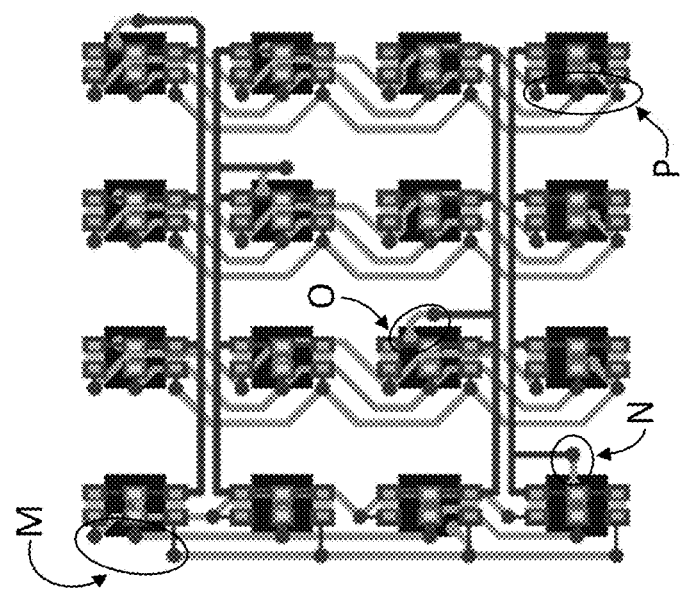

FIG. 13D matches the top view of the 4×4 LED package and the exploded view of the this device. The array of RGB LED chips are disposed on the first layer 60*a*-1. The traces in the first layer 60*a*-1 that connect the cathodes of a plurality of LED chips are scan connections. On the other hand, anode nodes of the RGB LED chips are not interconnected in the first layer 60*a*-1.

For example, M and P are two clusters of anode nodes while nodes O and N are in the scan connection that connects the cathodes of the plurality of LED chips. All of M, P, O, N are disposed in the first layer 60*a*-1. O and N are further connected (through via holes in the interconnection layer 50*a*, not shown) with nodes O' and N' on the bypass traces in the second layer 60*a*-2, respectively. Nodes O' and N' in turn are connected through via holes to the metal pads in the third layer 60*a*-3. Likewise, M and P are respectively connected to their corresponding nodes M' and P' in the channel connection on the second layer 60*a*-2 and through the channel connection and via holes in the interconnection layer further connected to metal pads in the third layer 60*a*-3. As such, anodes of the LED chips (through nodes M, P, M', P' and corresponding traces and via holes) as well as cathodes of the LED chips (through nodes O, N, O', N', and corresponding traces and via holes) are connected with the metal pads. Note that the broken lines represent a conductive path between two nodes.

In this embodiment, the first, second, and the third layers are partially or completely disposed in the interconnection layer 50*a* of each LED package (Ba-1, Ba-2, Ba-3 or Ba-4), instead of on the PCB 80, thus creating additional space in the vertical direction in the LED chip.

Such a COB LED package are beneficial for several reasons. First, it reduces the number of pads and the complexity of traces on the PCB and its manufacturing cost. In addition, building layers of traces in the LED chips frees up spaces on the PCB otherwise occupied by the conductive tracks so that more LED chips can be mounted on PCB, which allows a higher density of LED chips and high resolution for the display module.

The embodiments in the present disclosure can be applied to the LED display of either a common cathode topology or a common anode topology. In a common anode topology, the anodes of the RGB LEDs are operatively connected to a same power source via scan lines controlled by scan switches while the cathodes of the LEDs are tied to output of current drivers. In a common cathode topology, anodes of the R, G, or B LEDs are operatively connected to their respective power sources. As such, red LEDs, having a lower forward voltage, can be powered by a power source of output voltage lower than that of green or blue LEDs. Detailed description of common cathode LED panels and the related driver circuitry are available in one of Applicant's patents, e.g., U.S. Pat. No. 8,963,810.

The embodiments shown in FIGS. 13B-13D can be either arranged in common cathode topology or in common anode topology. In the common cathode topology, anodes of the LED chips are connected to the channel connection and the cathodes are connected to the scan connection. Conversely, in the common anode topology, cathodes of the LED chips are connected to the channel connection while the anodes are connected to the scan connection.

Figure 14A:
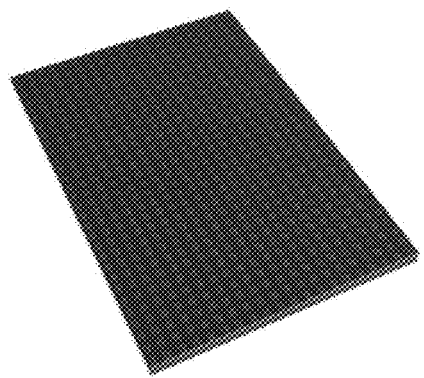
FIG. 14A is a perspective view showing a top surface of a 10×15 LED tile.
Figure 14B:
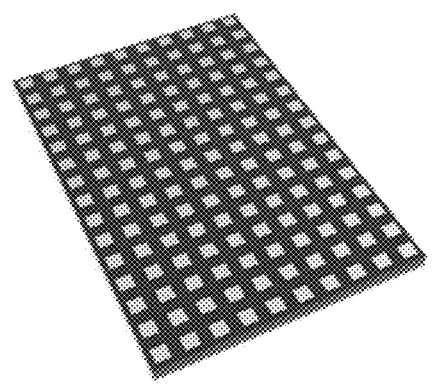
FIG. 14B is a perspective view showing a bottom surface of the 10×15 LED tile in FIG. 14A.
Figure 14C:
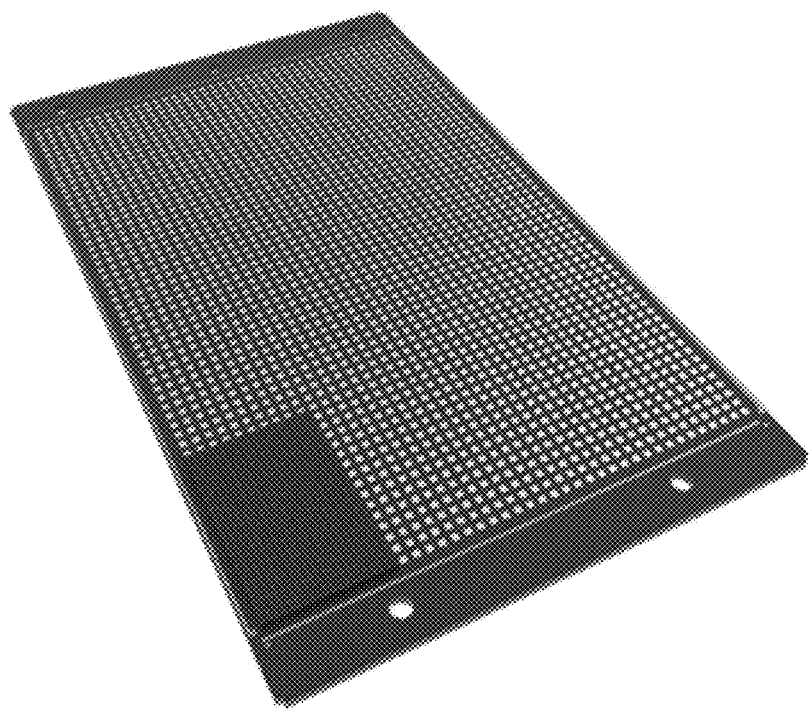
FIG. 14C is a perspective view showing a single LED tile attached on a PCB driver board.
Figure 14D:
FIG. 14D is a perspective view showing multiple LED tiles covering the PCB driver board.

An LED package having a large matrix (e.g., 10×15 matrix or more) of RGB LED units may be referred to as a LED tile. FIGS. 14A and 14B respectively show the top and bottom views of the tile. On the bottom surface of the tile, each metal pad covers one unit of RGB LEDs. As shown in FIG. 14C, this LED tile can be arranged on the PCB (i.e., driver board) to connect each metal pad of the LED tile to a corresponding conductive pad on the driver board. After arranging and attaching all required LED tiles on the driver board as shown in FIG. 14D, the surface of the LED tiles may be encapsulated for fixing the LED tiles to the driver board and protecting the LED chips thereon.

Embodiments of the present disclosure have been described in detail. Other embodiments will become apparent to those skilled in the art from consideration and practice of the present disclosure. Accordingly, it is intended that the specification and the drawings be considered as exemplary and explanatory only, with the true scope of the present disclosure being set forth in the following claims.

What is claimed is:

1. A light emitting diode (LED) assembly, comprising:
an LED array, a passivation layer disposed about the LED array, and an array of metal pads,
wherein the LED array comprises a plurality of LED chips, each LED chip comprises a first terminal and a second terminal,
wherein the first terminal of each LED chip in the LED array is electrically coupled to a first network of conductive tracks, and
the second terminal of each LED chip in the LED array is electrically coupled to a second network of conductive tracks,
wherein each metal pad in the array of metal pads has a first surface in contact with the passivation layer and a second surface positioned outside of the passivation layer,
wherein the first terminal and the second terminal of an LED chip are respectively electrically coupled to the first surfaces of two metal pads in the array of metal pads,
wherein the first network of conductive tracks and the second network of conductive tracks comprise traces disposed in a planar direction and in a vertical direction in the passivation layer, and
wherein the passivation layer comprises one or more dielectric materials.

2. The LED assembly of claim 1, wherein the first terminal is a cathode and the second terminal is an anode.

3. The LED assembly of claim 1, wherein the first terminal is an anode and the second terminal is a cathode.

4. The LED assembly of claim 1, wherein the first network of conductive tracks comprise traces residing in a first plane and the second network of conductive tracks comprise traces residing in a second plane, and a first plurality of via holes are disposed between the first plane and the second plane.

5. The LED assembly of claim 4, wherein the first surfaces of metal pads in the array of metal pads reside on a third plane in the passivation layer, and a second plurality of via holes are disposed between the second plane and the third plane.

6. The LED assembly of claim 1, wherein the LED chips in the LED array include red LED chips, green LED chips, and red LED chips.

7. A method of fabricating the light emitting diode (LED) assembly of claim 1, comprising:
disposing an LED array comprising a plurality of LED chips on a carrier panel, wherein each LED chip in the LED array has a first terminal and a second terminal that face away from the carrier panel;
covering the LED array with a molding compound layer;
disposing a first passivation layer on the molding compound layer;
disposing a second passivation layer on the first passivation layer;
disposing an array of metal pads on the second passivation layer;
forming a first network of conductive tracks in the first passivation layer, wherein the first network of conductive tracks connect the first terminal of each LED chip in the LED array and at least one metal pad in the array of metal pads; and
forming a second network of conductive tracks in the second passivation layer, wherein the second network of conductive tracks connect the second terminal of each LED chip in the LED array and at least one metal pad in the array of metal pads.

8. The method of claim 7, further comprising:
attaching the array of metal pads to a plurality of testing circuits; and
testing the LED array on the carrier panel.

9. The method of claim 7, further comprising:
cutting through the first passivation layer and the second passivation layer to separate the LED array; and
de-bonding the cut LED array from the carrier panel to obtain a plurality of LED packages.

10. The method of claim 7, wherein each LED chip in the LED array is a substrate-less LED chip.

11. The method of claim 7, wherein the first network of conductive tracks comprises traces residing in a first plane and the second network of conductive tracks comprise traces residing in a second plane, and a first plurality of via holes are disposed between the first plane and the second plane.

12. The method of claim 11, wherein the first surfaces of metal pads in the array of metal pads reside on a third plane in the second passivation layer, and a second plurality of via holes are disposed between the second plane and the third plane.

13. The method of claim 12, wherein the first surfaces of metal pads in the array of metal pads reside on a third plane in the second passivation layer, and a second plurality of via holes are disposed between the second plane and the third plane.

14. The method of claim 7, wherein the first terminal is a cathode and the second terminal is an anode.

15. The method of claim 7, wherein the first terminal is an anode and the second terminal is a cathode.

16. An LED display panel, comprising a plurality of LED tiles, each LED tile comprises a plurality of LED assembly of claim 1 mounted on a printed circuit board (PCB).

17. The LED display panel of claim 16, having a common cathode topology.

18. The LED display panel of claim 16, having a common anode topology.

* * * * *